United States Patent
Nishiyama et al.

(10) Patent No.: US 7,211,797 B2
(45) Date of Patent: May 1, 2007

(54) INSPECTION METHOD AND INSPECTION SYSTEM USING CHARGED PARTICLE BEAM

(75) Inventors: Hidetoshi Nishiyama, Higashiyamato (JP); Mari Nozoe, Hino (JP)

(73) Assignee: Hitachi High-Technologies Corporation, Tokyo (JP)

( * ) Notice: Subject to any disclaimer, the term of this patent is extended or adjusted under 35 U.S.C. 154(b) by 130 days.

(21) Appl. No.: 11/098,699

(22) Filed: Apr. 5, 2005

(65) Prior Publication Data
US 2005/0218325 A1    Oct. 6, 2005

(30) Foreign Application Priority Data
Apr. 5, 2004 (JP) .............................. 2004-111061

(51) Int. Cl.
*G21K 7/00* (2006.01)
(52) U.S. Cl. ..................... 250/311; 250/310; 250/307; 382/172; 382/169; 382/168
(58) Field of Classification Search .................. None
See application file for complete search history.

(56) References Cited

U.S. PATENT DOCUMENTS 6,995,370 B2*   2/2006   Fujita et al. ................. 250/310

FOREIGN PATENT DOCUMENTS

| JP | 11-121561 | 4/1999 |
| JP | 2001-313322 | 11/2001 |

OTHER PUBLICATIONS

L. Reimer: Scanning Electron Micoscopy, Spring er-Verlag, Berlin Heidelberg, 1998.
H. Nishiyama, et al.: SPIE 4344, p. 12 (2001).

* cited by examiner

*Primary Examiner*—Jack Berman
*Assistant Examiner*—Zia R. Hashmi
(74) *Attorney, Agent, or Firm*—Antonelli, Terry, Stout and Kraus, LLP

(57) ABSTRACT

The present invention provides an inspection technique using a charged particle beam by which a method of setting a condition for optimally charging an object to be inspected without relying on an operator's experience is established and a voltage contrast image with higher efficiency of defect detection than ever before can be obtained. The inspection method comprises the steps of scanning an area on a surface of a substrate having a specific pattern formed thereon with a primary charged particle beam, detecting signals of secondary electrons emitted from the area, forming an image of the area from detected signals, and generating a histogram from the image. All these steps are performed each time a condition of irradiation with the charged particle beam is changed. When two or more separate peaks appear in the histogram, the histogram is determined as an optimal condition for inspection, and inspection is performed based on the image obtained under that condition.

15 Claims, 16 Drawing Sheets

| PLUGGED PATTERN | CONTACT HOLE WITH THE ASPECT RATIO OVER 7 | PATTERN WITH pn JUNCTION | INSPECTION CONDITION |
|---|---|---|---|
| X | X | X | ① |
| X | X | O | ① |
| X | O | X | ② |
| X | O | O | ② |
| O | X | X | ① |
| O | X | O | ③ |
| O | O | X | ③ |
| O | O | O | ③ |

US 7,211,797 B2

INSPECTION METHOD AND INSPECTION SYSTEM USING CHARGED PARTICLE BEAM

CLAIM OF PRIORITY

The present invention claims priority from Japanese application JP 2004-111061 filed on Apr. 5, 2004, the content of which is hereby incorporated by reference on to this application.

BACKGROUND OF THE INVENTION

The preset invention relates to board production technology for boards having microscopic circuit patterns such as semiconductor devices and liquid crystal and, more particularly, to a technique for inspecting patterns of semiconductor devices, photomasks, and the like.

Semiconductor devices are manufactured by repeating a process of printing a pattern formed with a photomask on a wafer by lithography and etching. To inspect such a pattern, identifying a defect by obtaining a Scanning Electron Microscope (SEM) image of the pattern is performed. Recently, as patterns have become finer and finer, contact holes become more difficult to form. The number of disconnected failure patterns occurring inside the contact holes notably increases and there is a need for a high sensitivity defect detection technique.

A wafer cross section view 400 is shown in FIG. 4 to depict a contact hole defect. This section of a wafer structure is made by growing a silicon oxide film 405 on a silicon substrate 404, patterning contact holes, and filling the holes with metal. Among the contact holes, there are a normal pattern 401 and a disconnected failure pattern 402. To detect this defective contact hole, after charging the wafer, a voltage contrast image should be obtained to distinguish between the normal pattern and the disconnected failure pattern having different electrical resistances resulting in different potentials of changing voltage which are represented as difference in the number of secondary electrons.

A method of obtaining a voltage contrast image and a principle of defect detection are described. A voltage contrast image may be obtained by either (1) positively charging or (2) negatively charging the surface of a sample. The polarity of charging appropriate for inspection differs, depending on the wafer structure to be inspected. The polarity of charging can be changed, depending on a condition for inspection. For instance, there is a method of changing incident electron beam energy (e.g., refer to L. Reimer: Scanning Electron Microscopy, Springer-Verlag, Berlin Heidelberg, 1998).

Now, let us discuss another method in which the voltage of charging voltage control electrodes 407 installed facing toward the wafer is changed. For both positive charging and negative charging, the energy of an incident electron beam 410 onto the wafer is controlled so that the efficiency of secondary electron emission from the wafer will be 1 or more (e.g., 500 eV).

(1) In the case of positive charging; the voltage of the charging voltage control electrodes 407 is set so that an electric field generated in the vicinity of the wafer accelerates the secondary electrons. Specifically, as shown in FIG. 5 (an enlarged view of a beam irradiation area), a positive charging voltage potential 501 is formed above the wafer. When the electron beam hits the normal pattern 401 and the disconnected failure pattern 402, the secondary electrons 502 emitted therefrom are accelerated by the potential 501 and the disconnected failure pattern 402 is positively charged. The normal pattern 401 is not charged because it is electrified from the substrate 404. Because of the positively charged state of the disconnected failure pattern 402, a low energy portion of secondary electrons 503 from it is drawn back to the wafer. On the other hand, because the normal pattern 401 is not charged with the beam, all secondary electrons 504 from it are emitted. As a result, a voltage contrast 505 is obtained and the disconnected failure can be detected as a dark object in the image (e.g., refer to H. Nishiyama, et al.: SPIE 4344, p. 12 (2001), Japanese Patent Application Laid-Open No. 2001-313322).

(2) In the case of negative charging; the voltage of the charging voltage control electrodes 407 is set so that the electric field generated in the vicinity of the wafer decelerates the secondary electrons to make them back to the wafer. Specifically, as shown in FIG. 6 (an enlarged view of a beam irradiation area), a negative charging voltage potential 601 is formed above the wafer. When the electron beam hits the normal pattern 401 and the disconnected failure pattern 402, the secondary electrons 602 emitted therefrom are drawn back to the wafer by the potential 601 and, consequently, the disconnected failure pattern 402 is negatively charged. Because of the negatively charged state of the disconnected failure pattern 402, the secondary electrons 603 from it are accelerated and emitted without being drawn back by the negative charging voltage potential 601. On the other hand, because the normal pattern is not charged with the beam, all secondary electrons 604 from it are drawn back to the wafer. As a result, a voltage contrast image 605 is obtained and the disconnected failure can be detected as a light object in the image (e.g., refer to Japanese Patent Application Laid-Open No. 11-121561).

SUMMARY OF THE INVENTION

The above charging voltage potential can be changed by changing the voltage of the charging voltage control electrodes 407. When a positive charging voltage contrast is obtained, increasing the voltage of the charging voltage control electrodes 407 makes it easy to emit the secondary electrons and, consequently, the charging voltage potential increases. For negative charging, decreasing the voltage of the charging voltage control electrodes 407 make more secondary electrons back to the wafer and, consequently, the charging voltage potential decreases. However, unless the charging voltage potential for a wafer is set optimum, the sensitivity of inspection decreases. If the charging amount (in proportional to the absolute value of the charging voltage potential) is too large or too small, the sensitivity decreases.

(1) When the charging amount is too large; charge leakage occurs in a disconnected failure pattern and the pattern cannot be charged fully. There is a fear that the failure pattern is erroneously recognized as a normal pattern. When the charging amount is too large, the secondary electrons are bent to a greater degree, which affects the efficiency of detecting the secondary electrons. As a result, distortion and light spots occur in the image obtained and the accuracy of defect detection decreases.

(2) When the charging amount is too small; difference in charging between the normal pattern and the disconnected failure pattern is small, which results in a small contrast therebetween, making it hard to detect a defect.

As noted above, for high sensitivity inspection, it is needed to ensure a sufficient contrast between normal and failure patterns, while keeping the charging amount within a limit. The condition for inspection has heretofore been set manually by the operator's experience. For this reason, the setting operation takes time and the repeatability of inspection is poor, and an accuracy problem of inspection exists.

It is therefore an object of the present invention to provide an inspection technique using a charged particle beam by which a method of setting the condition for optimally charging an object to be inspected without relying on the operator's experience is established and a voltage contrast image with higher efficiency of defect detection than ever before can be obtained.

To achieve the foregoing object, from the perspective of "finding the condition for minimizing the charging amount, while keeping the contrast level required for inspection", the present inventors found out acquiring histograms of voltage contrast images and using the forms of the histograms for determining that condition.

A basic constitution of the present invention will be described below.

FIG. 7 shows a voltage contrast image 703 and its histogram 704. In the histogram 704, there are two peaks 702, 701 respectively produced by pattern areas (contact holes, wiring, etc.) and other insulation areas.

First, the image histogram is fit to the sum of two Gaussian functions (Equation 1) (i=1, 2)

$$p(x) = \sum_i \frac{A_i}{\sqrt{2\pi\sigma_i^2}} \exp\left(-\frac{(x-\mu_i)^2}{2\sigma_i^2}\right) \quad \text{(Equation 1)}$$

where x is a signal value and p(x) is the frequency of appearance of the signal value x.

Then, the Gaussian functions are assumed to have averages $\mu_1$ and $\mu_2$ and standard deviations $\sigma_1$ and $\sigma_2$, respectively.

Now, $|\mu_1-\mu_2|/(\sigma_1+\sigma_2)$ is evaluated depending on a condition for inspection which is altered (e.g., the voltage Vcc of the charging voltage control electrodes 407). An optimal condition is determined subject to a constraint of Equation 2.

$$\varepsilon_1 < \frac{|\mu_1 - \mu_2|}{\sigma_1 + \sigma_2} < \varepsilon_2 \quad \text{(Equation 2)}$$

where, typically, 1 and 3 are assigned to $\epsilon_1$ and $\epsilon_2$ respectively, though these values may be altered by situational decision-making.

As for functions to which the histogram should be fit, other than the above Gaussian functions, a function with an isolate peak such as a Lorentz function (Equation 3) may be used.

$$p(x) = \sum_i \frac{a_i^2}{(x-x_{0,i})^2 + a_i^2} \quad \text{(Equation 3)}$$

In the present means, it is important to evaluate the histogram and, therefore, auto brightness and contrast control of signal values must not be performed, when the image is obtained, while changing the electron irradiation condition.

While the instance where two peaks are present in the histogram has been discussed herein, if there are three or more peaks, the same evaluation must be performed for adjacent peaks.

As an example of optimizing the inspection condition, now let us discuss optimizing the voltage Vcc of the charging voltage control electrodes 407.

FIG. 8 shows negative changing voltage contrast images 801 to 803 respectively obtained when the voltage of the charging voltage control electrodes 407 is set at −8440 V, −8460 V, and −8510 V, as inspection conditions and their histograms 804 to 806. As the voltage of the charging voltage control electrodes 407 decreases, the negative charging voltage decreases. When the charging amount is small, because two separate peaks do not appear (a histogram 804), the patterns are not clear (a voltage contrast image 801), and it becomes hard to inspect the patterns. On the other hand, when the charging amount is large, two separate peaks appear (a histogram 805) and the patterns are clear (a voltage contrast image 802) and can be inspected well. However, when the charging amount becomes too large (a histogram 806 and a voltage contrast image 803), this results in a decrease in sensitivity. In view of the above, an optimum condition is determined, according to the following method:

(1) obtain voltage contrasts and their histograms, while altering the voltage Vcc of the charging voltage control electrodes 407 installed facing toward the wafer;

(2) choose histograms where two peaks respectively produced by the insulation areas and the pattern areas appear; and (3) apply a constraint equation (2) ($\epsilon_1$=1, $\epsilon_2$=3) as the condition for ideal separate peaks and determine Vcc=−8460 V as the optimal condition, as is shown in FIG. 9.

(4) The results of actual inspection are shown in FIG. 10 where the number of defects detected is the most under the optimal condition (Vcc=−8460 V) and a smaller number of defects is detected at other voltages because some defects cannot be detected under other conditions.

As above, the optimal condition for inspection can be determined. However, as the inspection condition is changed, remaining charges may affect the subsequent voltage contrast image. In that event, the charges should be neutralized by irradiating the wafer with ultraviolet light. Alternatively, a wafer portion from where an image is obtained should be shifted from one portion to another whenever an image is acquired.

A type of defects to be inspected is disconnected failure of contact holes and line patterns, which represents a major part of defects.

According to the present invention, the inspection technique using a charged particle beam can be realized by which the method of setting the condition for optimally charging an object to be inspected without relying on the operator's experience is established and a voltage contrast image with higher efficiency of defect detection than ever before can be obtained.

DETAILED DESCRIPTION OF THE PREFERRED EMBODIMENTS

Preferred embodiments of the present invention will be described in detail hereinafter with reference to the drawings.

(First Embodiment)

Figure 1:
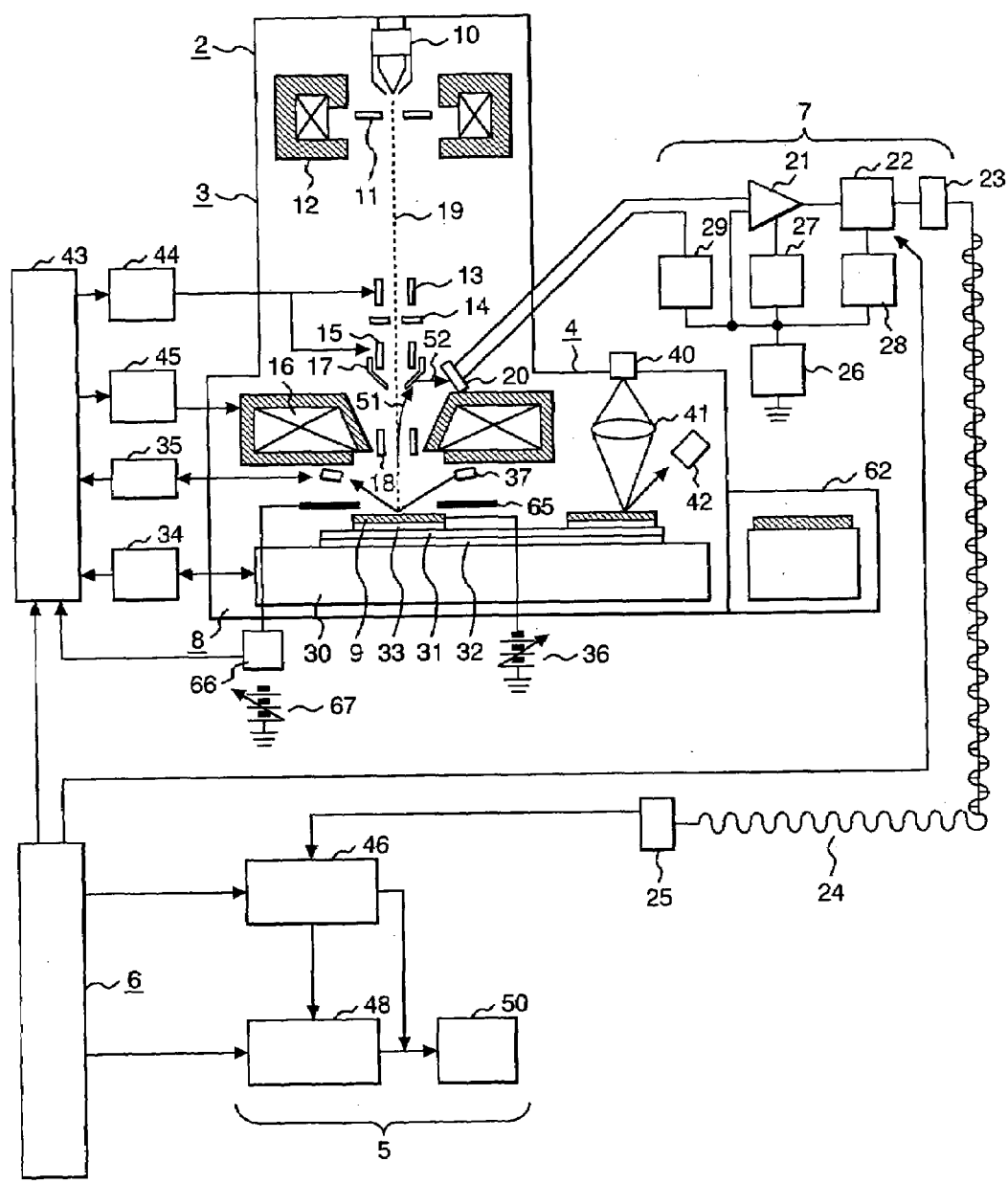
FIG. 1 is a diagram to explain an SEM inspection system configuration for use in a first embodiment of the present invention.

FIG. 1 shows an inspection system configuration according to a first embodiment of the invention. The inspection system. (SEM inspection system) is equipped with a chamber for inspection 2 which is degassed and evacuated and a reserve chamber (not shown in this embodiment) for feeding a wafer 9 as a sample inside the chamber for inspection 2. This reserve chamber is arranged so that it can be degassed and evacuated independently of the chamber for inspection 2. The inspection system also includes a control unit 6 and an image processing unit 5 in addition to the chamber for inspection 2 and the reserve chamber. The internals of the chamber for inspection 2 roughly comprise electron optics 3, a charging voltage control unit, a detection unit 7, a sample chamber 8, and an optical microscopy unit 4.

The electron optics 3 comprise a cathode 10, electron beam extraction electrodes 11, condenser lenses 12, blanking deflectors 13, apertures 14, objective lenses 16, converter electrodes 17, and E□ (E cross B) deflectors 18. A detector 20 out of the detection unit 7 is placed above one objective lens 16 within the chamber for inspection 2. An output signal of the detector 20 is amplified by a preamplifier 21 installed outside of the chamber for inspection 2 and converted into digital data by an AD converter 22.

The charging voltage control unit comprises charging voltage control electrodes 65 installed facing toward the stage, a charging voltage control electrode control unit 66, and a charging voltage control electrode power supply 67.

The detection unit 7 comprises the detector 20 within the degassed vacuum chamber for inspection 2, the preamplifier 21, the AD converter 22, an optical signal converter 23, an optical fiber 24, an electrical signal converter 25, a high voltage power supply 26, a preamplifier power supply 27, an AD converter power supply 28, and a reverse bias power supply 29 which are external to the chamber for inspection 2. The detector 20 out of the detection unit 7 is placed above one objective lens 16 within the chamber for inspection 2. The detector 20, preamplifier 21, AD converter 22, optical signal converter 23, and preamplifier power supply 28 are floated to positive voltage by the high voltage power supply 26. The sample chamber 8 comprises a sample holder 30, an X-direction stage 31, a Y-direction stage 32, a rotation stage 33, a stage position monitoring sensor 34, and an optical height sensor 35.

The optical microscopy unit 4 is installed near the electron optics 3 within the chamber for inspection 2, but separated from the optics by a distance enough to avoid a mutual effect on each other. The distance between the electron optics 3 and the optical microscopy unit 4 is known. The X-direction stage 31 and the Y-direction stage 32 are arranged to reciprocate over the known distance between the electron optics 3 and the optical microscopy unit 4. The optical microscopy unit 4 comprises a light source 40, an optical lens 41, and a CCD camera 42.

Instructions for causing each component of the system to operate and conditions for operation are input to the control unit 6 and output therefrom to each component. Various conditions of an acceleration voltage when an electron beam is generated, electron beam deflection width, deflection speed, signal capturing timing of the detection unit, speed at which the sample holder moves, etc. are input in advance to the control unit 6 so that any of the conditions can be set arbitrarily or selected and set, according to the purpose. Using a correction control circuit 43, the control unit 6 monitors for deviation in position and height, according to signals from the stage position monitoring sensor 34 and the optical height sensor 35, generates a correction signal, according to the results of the monitoring, and sends the correction signal to a lens power supply 45 and a scanning signal generator 44 so that an electron beam always hits a correct spot.

To obtain an image of a wafer 9, a narrow focused electron beam 19 is applied to the wafer to emit secondary electrons and back scattering electrons 51 from the wafer 9. By detecting these electrons in synchronization with scanning the electron beam 19 and the movements of the stages 31 and 32, an image of the wafer 9 surface is obtained.

For the cathode 10, a thermal field emission cathode of a diffusion resupply type is used. By using this cathode 10, it is ensured that more stable electron beam current is generated than a conventionally used cathode such as, e.g., a tungsten (W) filament cathode and a cold field emission cathode, and, consequently, a voltage contrast image with less variation in luminance can be obtained. The electron beam 19 is drawn from the cathode 10 by applying a voltage between the cathode 10 and the extraction electrodes 11. The electron beam 19 is accelerated by applying a negative high voltage potential of high voltage to the cathode 10.

By being thus accelerated, the electron beam 19 with energy corresponding to its potential travels toward the sample holder 30. The electron beam 19 is converged by the condenser lenses 12, narrow focused by the objective lenses 16, and applied to the wafer 9 mounted on the X- and Y-direction stages 31 and 32 on the sample holder 30. The scanning signal generator 44 which generates a scanning signal and a blanking signal is connected to the blanking deflectors 13 and the lens power supply 45 is connected to the condenser lenses 12 and the objective lenses 16. A negative voltage (retarding voltage) can be applied to the wafer 9 from a retarding power supply 36. By adjusting this retarding power supply 36, a primary electron beam is decelerated and the electron beam irradiation energy to the wafer 9 can be adjusted to an optimal value without changing the voltage of the cathode 10.

The secondary electrons and back scattering electrons 51 emitted by applying the electron beam 19 to the wafer 9 are accelerated by a negative voltage applied to the wafer 9. The E□ deflectors 18 are located above the wafer 9 to deflect the secondary electrons and back scattering electrons 51 toward predetermined directions. The magnitude of the deflection can be adjusted by changing the voltage and the magnetic field energy applied to the E□ deflectors 18. This electromagnetic field can be varied in conjunction with the negative voltage applied to the sample. The secondary electrons and back scattering electrons 51 deflected by the E□ deflectors 18 strike against the converter electrodes 17 under a predetermined condition. When the accelerated secondary electrons and back scattering electrons 51 strike against the converter electrodes 17, second secondary electrons and back scattering electrons 52 are emitted from the converter electrodes 17.

The second secondary electrons and back scattering electrons 52 emitted when the electrons strike against the converter electrodes 17 are guided to the detector 20 by an attractive electric field. The detector 20 is configured to, in concurrence with timing of scanning the electron beam 19, detect the second secondary electrons and back scattering electrons 52 emitted when the secondary electrons and back scattering electrons 51 emitted during the application of the electron beam 19 to the wafer 9 are then accelerated and strike against the converter electrodes 17. An output signal of the detector 20 is amplified by the preamplifier 21 installed outside of the chamber for inspection 2 and converted into digital data by the AD converter 22. The AD converter 22 is configured to convert an analog signal detected by the detector 20 into digital signal immediately after being amplified by the preamplifier 21 and transmit the digital signal to the image processing unit 5. Because the detected analog signal is digitized and transmitted immediately after being detected, a signal to be handled at a high speed and with a high S/N ratio can be obtained. As the detector 20 employed herein, for example, a semiconductor detector may be used.

The wafer 9 is mounted on the X- and Y-direction stages 31 and 32. Either of the following methods of scanning can be selected: a method of scanning the electron beam 19 in two dimensions with the X- and Y-direction stages 31 and 32 standing still when inspection is executed; and a method of scanning the electron beam 19 linearly in the X direction while moving the X- and Y-direction stages 31 and 32 in the Y direction continuously at a constant speed when inspection is executed. If a specific relatively small area is inspected, the former method for inspection by scanning with the stages standing still is effective. If a relatively wide area is inspected, the latter method for inspection by scanning while moving the stages continuously at a constant speed is effective. When it is necessary to blank the electron beam 19, the electron beam 19 is deflected by the blanking deflectors 13 and can be controlled not to pass through the apertures 14.

As the stage position monitoring sensor 34, a length measuring sensor using laser interference, is used in this embodiment. The positions of the X- and Y-direction stages 31 and 32 can be monitored in real time and the measurements are transferred to the control unit 6. The mechanism is configured such that data for the rotating speeds or the like of the motors of the X-direction stage 31, Y-direction stage 32, and rotation stage 33 are also transferred to the control unit 6. Based on the above data, the control unit 6 can correctly identify an area and position being irradiated with the electron beam 19 and is arranged to make real-time correction for deviation in position to be irradiated with the electron beam 19 by the correction control circuit 43, if necessary. An area irradiated with the electron beam can be stored per wafer.

As the optical height sensor 35, an optical sensor based on a measurement method other than using an electron beam, for example, a laser interference sensor or a reflected light sensor which measures a change in reflected light position. This sensor is configured to measure the height of the wafer 9 mounted on the X- and Y-direction stages 31 and 32 in real time. In this embodiment, a method in which white light emitted from a light source 37 is applied to the wafer 9, the reflected light position is detected by a position detecting monitor, and a change in height is calculated from a change in the position is used. Based on the measurement data obtained by the optical height sensor 35, the focal length of the objective lenses 16 to narrow focus the electron beam 19 is corrected dynamically, so that an area to be inspected can always be irradiated with the electron beam 19 focused on that area. The mechanism can also be configured to measure warpage and height distortion of a wafer 9 in advance before irradiation with the electron beam and to set conditions for correcting the focal length of the objective lenses 16 per area to be inspected, based on the measurement data.

The image processing unit 5 comprises an image storing unit 46, a calculation unit 48, and a monitor 50. Wafer 9 image signals detected by the above detector 20 are amplified by the preamplifier 21 and converted into digital signals by the AD converter 22. Then, the digital signals are converted into optical signals by the optical signal converter 23, the optical signals are transmitted through the optical fiber 24 and converted into electrical signals by the electrical signal converter 25, and the electrical signals are stored into the image storing unit 46.

Electron beam irradiation conditions for generating an image and various detection conditions for the detection unit are set in advance when an inspection condition setting operation is performed and stored into files and on a database.

Figure 2A:
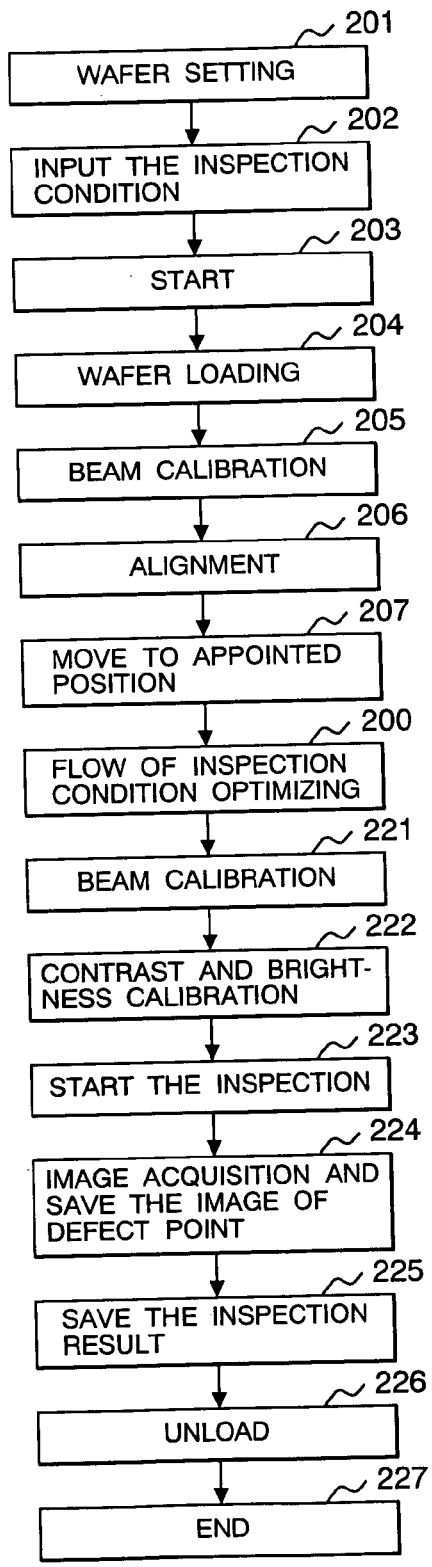
FIG. 2A is a flowchart to explain an example of an inspection flow in the first embodiment of the present invention.

Next, a procedure of inspection with the inspection system shown in FIG. 1 will be described with a flowchart shown in FIG. 2A.

First, in step 201, set a wafer in an arbitrary shelf in a wafer cassette and set the wafer cassette in place. To specify the wafer to be inspected, specify the in-cassette number of the shelf in which the wafer has been set via the monitor 50. In step 202, enter various conditions for inspection via the monitor 50. Entries as the conditions for inspection include the settings of electron beam current, electron beam irradiation energy, view size of a screen (Field Of View (FOV)), voltage of the retarding power supply 36. voltage of the charging voltage control electrodes 65, etc. Although individual parameters can be entered, combinations of various parameters for inspection for the above settings are normally stored in inspection condition files and on a database. Input operation can be performed simply by selecting appropriate inspection condition files and entering the identifiers of the files, according to the scope of inspection.

In step 203, automatic inspection gets started. In step 204, initially, the wafer 9 that has been set is loaded from a sample exchange chamber 62 into the inspection system. The wafer handling unit can accommodate wafers 9 with different diameters and different wafer shapes such as an orientation flat wafer or a notched wafer by using a wafer holder for supporting a wafer 9 appropriate for wafer size and shape. The wafer 9 is removed from the wafer cassette and mounted on the holder by a wafer loading/unloading unit including an arm, an auxiliary vacuum chamber, etc. The wafer supported by the holder is degassed and evacuated in the wafer loading/unloading unit and carried into the chamber for inspection 2 which has already been evacuated by a vacuum unit.

After the wafer is loaded, in step 205, electron beam irradiation conditions are set on the components by the control unit 6, based on the entered conditions for inspection. The stage 32 is moved so that a first beam calibration pattern on the wafer holder is positioned under the electron optics. A voltage contrast image of the beam calibration pattern is obtained and focusing and astigmatism adjustments are performed, according to the voltage contrast image. After a move to a predetermined place on the wafer 9 to be inspected, a voltage contrast image of the wafer 9 is obtained and contrast adjustment is performed. If it is necessary to change the electron beam irradiation conditions or the like, beam calibration can be performed again. A correlation between height information obtained by the optical height sensor 35 and the electron beam focusing condition may be obtained. Subsequently, automatic adjustment to an optimal focusing condition in accordance with the wafer height detected can be performed without executing focusing each time a voltage contrast image is obtained.

In step 206, the wafer 9 that has been set is moved by the X- and Y-direction stages 31 and 32 in order that a first coordinate for alignment is observed by the optical microscopy unit 4. An optical microscopy image of an alignment pattern formed on the wafer 9 is observed on the monitor 50, it is compared with the corresponding pattern image stored in advance, and a position correction value for the first coordinate is calculated. After a move to a second coordinate on which a circuit pattern similar to the pattern on the first coordinate exists, apart from the first coordinate by a given distance, an optical microscopy image of the circuit pattern is observed in a similar manner and compared with the corresponding circuit pattern image stored for alignment and a position correction value for the second coordinate and rotational displacement of the second coordinate from the first coordinate are calculated.

After preparatory work including predetermined corrections with the optical microscopy unit 4, inspection area setting, etc. is completed as above, the wafer 9 is moved to under the electron optics 3 by the movements of the X- and Y-direction stages 31 and 32. When the wafer 9 is positioned under the electron optics 3, the same alignment work as performed with the optical microscopy unit 4 is performed for a voltage contrast image. Obtaining an voltage contrast image is performed in the following way. Based on the corrected coordinate values in the alignment operation with the optical microscopy unit, which have been stored, the electron beam 19 is applied to the same circuit pattern as observed by the optical microscopy unit 4 and scanned in two dimensions in the X and Y directions by the scanning deflectors 15. With this two-dimensional scanning of the electron beam, secondary electrons and back scattering electrons 51 emitted from a wafer portion to be observed are detected by the structures and actions of the above components for emission electron detection and a voltage contrast image is obtained. Because, with the optical microscopy unit 4, inspection position check and alignment and position adjustment have been performed and rotational correction also performed beforehand, alignment, position correction, and rotational correction can be performed at higher resolution, larger magnification, and higher accuracy than with optical images. When the electron beam 19 is applied to the wafer 9, the irradiation portion of the wafer is charged. To avoid the effect of this charging when the wafer is inspected, in the preparatory work before inspection including position and rotational correction, inspection area setting, etc., a circuit pattern to be irradiated with the electron beam 19 which exists out of the area to be inspected should be selected beforehand or arrangement is made such that the corresponding circuit pattern on a chip other than the chip to be inspected can be selected from the control unit 6 automatically. The result of the alignment thus performed is transferred to each control unit. When the wafer is inspected, rotation and the position coordinates are corrected by each control unit.

Figure 2B:
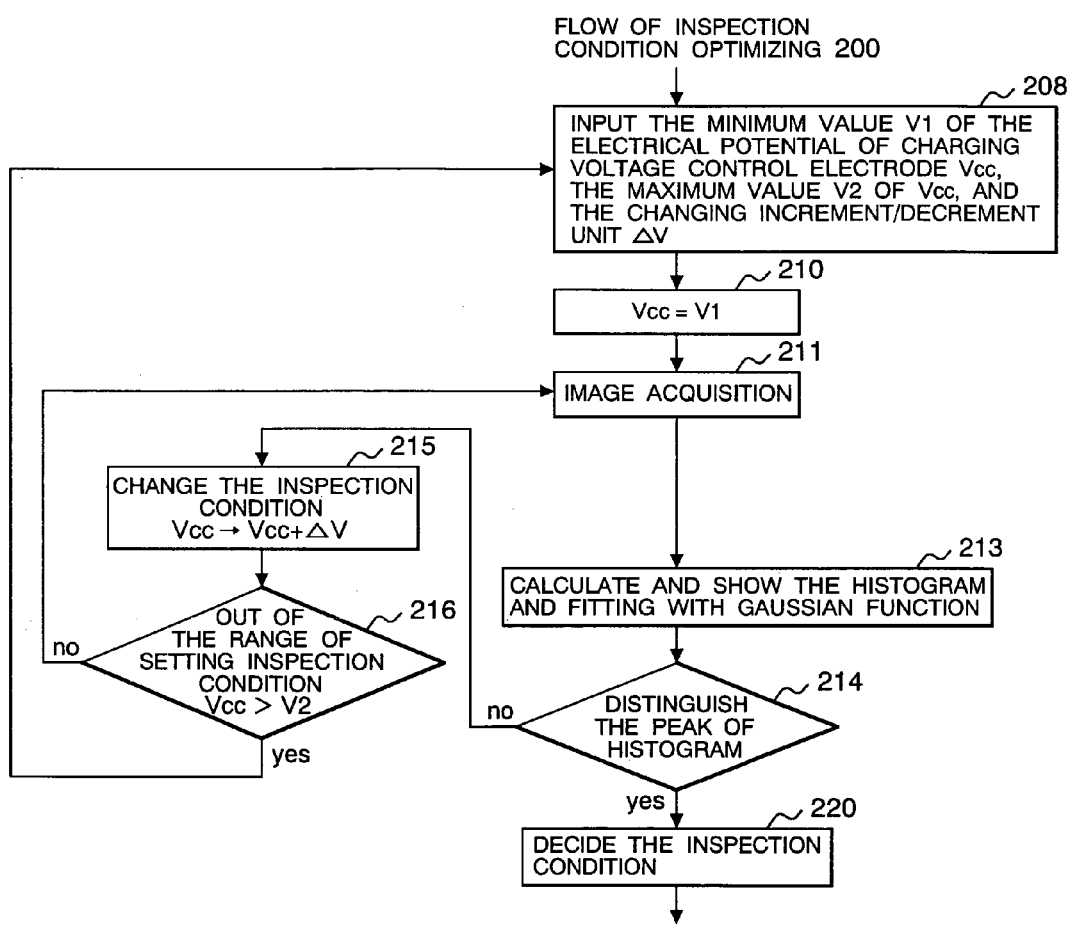
FIG. 2B is a flowchart to explain an example of a flow of inspection condition optimization included in the inspection flow of FIG. 2A.

In step 207, the wafer is moved to the specified area. Then, an optimal condition for inspection is determined, according to a flow of inspection condition optimization 200 (steps 208 to 220), as is illustrated in FIG. 2B. By way of example, one condition for inspection, voltage of the charging voltage control electrodes 65 is discussed below; the same principle applies to other conditions such as electron beam energy and retarding voltage. First, in step 208, a minimum voltage of Vcc, V1, a maximum voltage V2, and an increment/decrement unit ΔV in which the voltage is changed are input. In step 210, Vcc=V1 is input as an initial condition. In step 211, an image is obtained. When the image is obtained, auto brightness and contrast control of signal values is not performed. In step 213, a histogram of the image is calculated and the histogram is fit to the Gaussian functions, according to Equation 1. In step 214, it is determined whether separate peaks appear, based on Equation 2. If it is impossible to obtain separate peaks, the Vcc value is changed in step 215. By the decision made in step 216, if the changed value of Vcc falls within the range specified in step 208, an image is obtained again in step 211 and the above steps 211 to 216 are repeated. If the changed value of Vcc falls outside the range specified in step 208 by the decision made in step 216, a range must be input again in step 208. In this way, a condition for inspection is determined in step 220.

Figure 8:
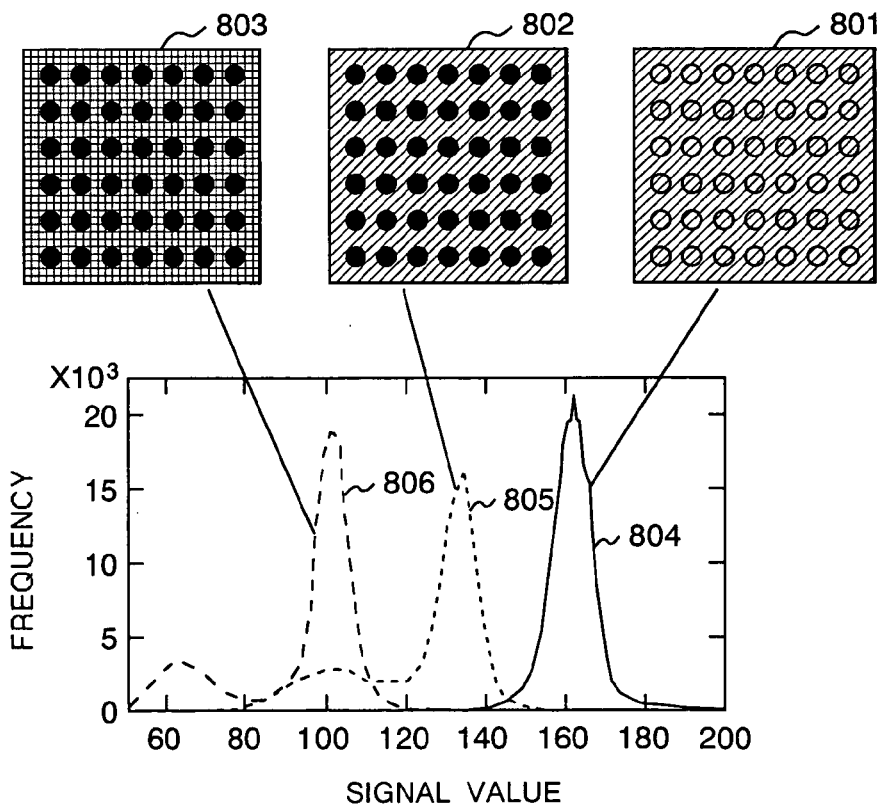
FIG. 8 is a diagram to explain voltage contrast images and their histograms depending on Vcc in the present invention.
Figure 9:
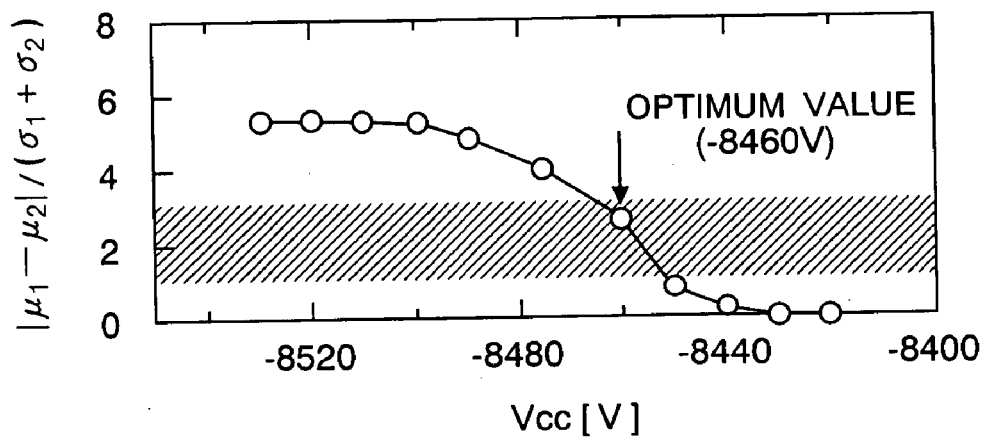
FIG. 9 is a graph used to determine an optimal condition for inspection in the present invention.
Figure 10:
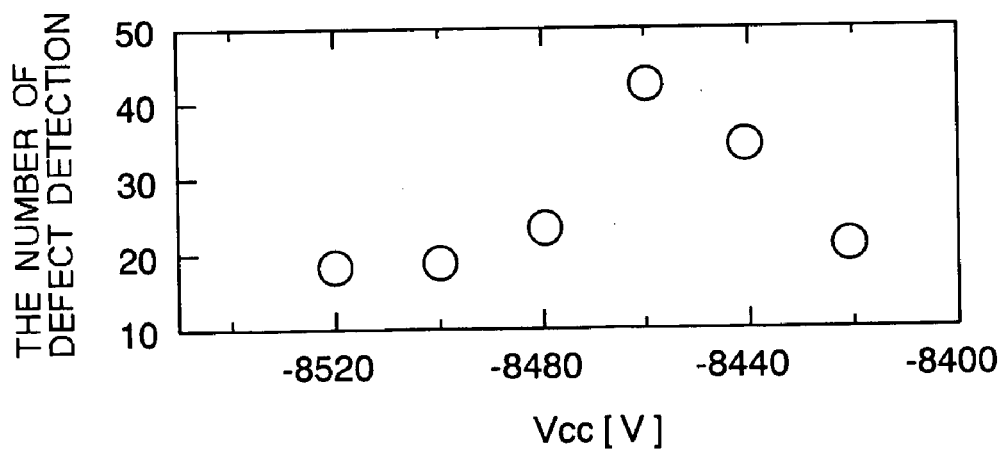
FIG. 10 is a graph to describe variance in the number of defects detected, depending on Vcc in the present invention.

The result of actual execution of these steps is discussed below. First, in step 208, V1 was set at −8530 V, V2 at −8420 V, and ΔV at 10 V. Images 801 to 803 obtained and a histogram 804 are shown in FIG. 8. These histograms are fit to Equation 1 and the averages $\mu_1$ and $\mu_2$ and standard deviations $\sigma_1$ and $\sigma_2$, of the Gaussian functions are obtained. Variance of $|\mu_1-\mu_2|/(\sigma_1+\sigma_2)$ depending on Vcc which is altered, which is shown in FIG. 9, was obtained. From this result, it was able to find Vcc=−8460 V satisfying the condition for ideal separate peaks, $\epsilon_1=1$ and $\epsilon_2=3$ in Equation 2 (a shaded zone in FIG. 9).

Next, in step 221, beam calibration is performed again in the same way as in step 205. After the beam calibration is completed, calibration is performed in step 222. Move to a second calibration pattern mounted on the sample holder occurs. The second calibration pattern is to match signal intensity levels with signal values in a voltage contrast image which is obtained during inspection. This pattern has contact holes with a sufficiently low resistance ($10^3$ Ω or below) and contact holes with a sufficiently high resistance ($10^{20}$ Ω or above) patterned. Using the voltage contrast image of this pattern, the signal values of sufficiently low resistance areas and sufficiently high resistance areas are calibrated. For the Sufficiently high resistance areas, insulation areas without patterns may be used. In light of the result of this calibration, after a move to the wafer 9, a voltage contrast image of the pattern areas on the wafer is obtained and calibration is performed.

Instep 223, inspection gets started. An image for defect detection is obtained in step 224 and saved in step 225. After inspection is completed, the wafer is unloaded in step 226 and the procedure terminates in step 227.

According to the above-described inspection method, problems with conventional SEM inspection such as a repeatability problem and a decrease in sensitivity of detecting a defect can be solved and well-repeatable and high sensitivity inspection can be performed.

While the embodiment wherein the voltage of the charging voltage control electrodes 65 is automatically set has been described, settings for other conditions such as electron beam current, electron beam energy, and retarding voltage can be performed in a similar manner.

While Gaussian functions are used as the functions to which histograms should be fit in this embodiment, a function with an isolated peak such as a Lorentz function may be used besides these functions.

When a condition for inspection is optimized, each time the condition is changed, image acquisition is performed, but the effect of charging and contamination under the previous condition may be unignorable. In this case, to eliminate such effect, ultraviolet light irradiation may be performed. Alternatively, a wafer area from where an image is obtained may be shifted from one area to another whenever the condition for inspection is changed.

If an image has shading, it is preferable to carry out the flow of inspection condition optimization 200 after shading correction is performed.

(Second Embodiment)

Figure 11:
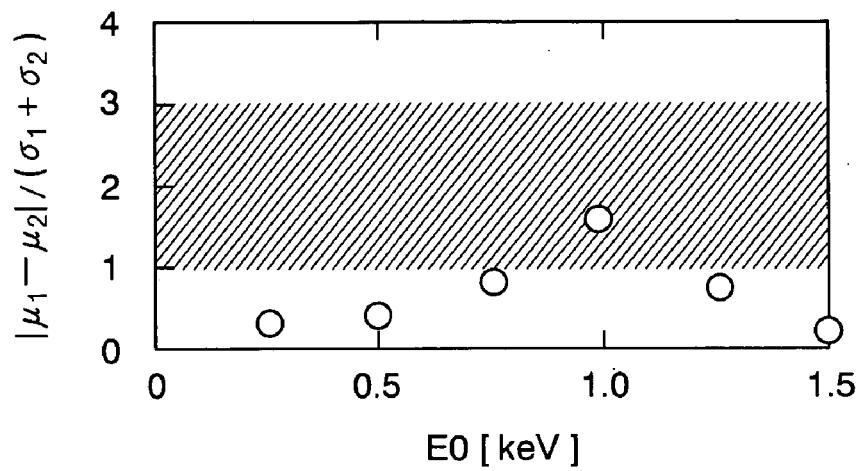
FIG. 11 is a graph used to determine optimum incident electron beam energy in a second embodiment of the present invention.

In a second embodiment, an instance where electron beam energy E0 is optimized by using the same method as for the first embodiment is discussed. Through consideration of wafer damage, a maximum value of E0 is set at 1.5 keV. In the flow of inspection condition optimization 200 (FIG. 2B), E0 replaces Vcc and 0 keV, 1.5 keV, and 0.25 keV replace V1, V2, and ΔV, respectively. As a result, variance of $|\mu_1-\mu_2|/(\sigma_1+\sigma_2)$ depending on E0 which is altered was obtained, as is shown in FIG. 11. From this result, it was able to find E0=1.0 keV satisfying the condition for ideal separate peaks, $\epsilon_1=1$ and $\epsilon_2=3$ in Equation 2.

(Third Embodiment)

Figure 12:
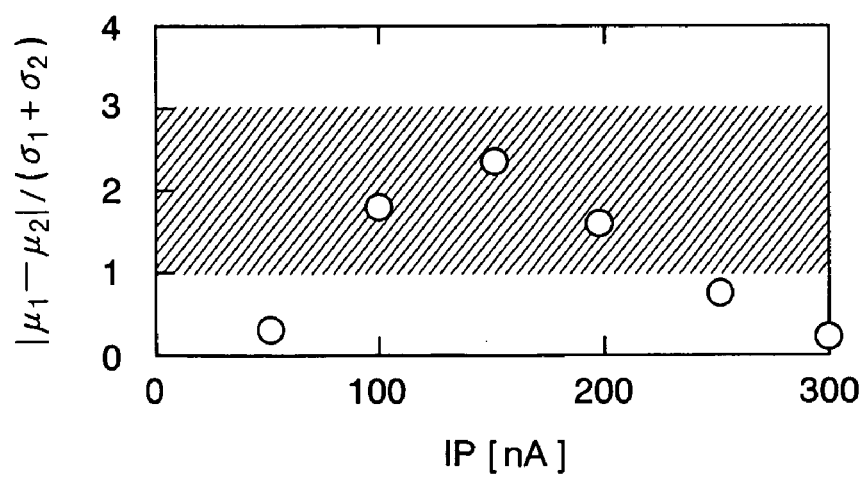
FIG. 12 is a graph used to determine an optimum electron beam current in a third embodiment of the present invention.

In a third embodiment, an instance where electron beam current IP is optimized by using the same method as for the first embodiment is discussed. In the flow of inspection condition optimization 200 (FIG. 2B), IP replaces Vcc and 0 nA, 300 nA, and 50 nA replace V1, V2, and ΔV, respectively. As a result, variance of $|\mu_1-\mu_2|/(\sigma_1+\sigma_2)$ depending on IP which is altered was obtained, as is shown in FIG. 12. From this result, it was able to find IP=100, 150, and 200 nA satisfying the condition for ideal separate peaks, $\epsilon_1=1$ and $\epsilon_2=3$ in Equation 2.

(Fourth Embodiment)

Figure 13:
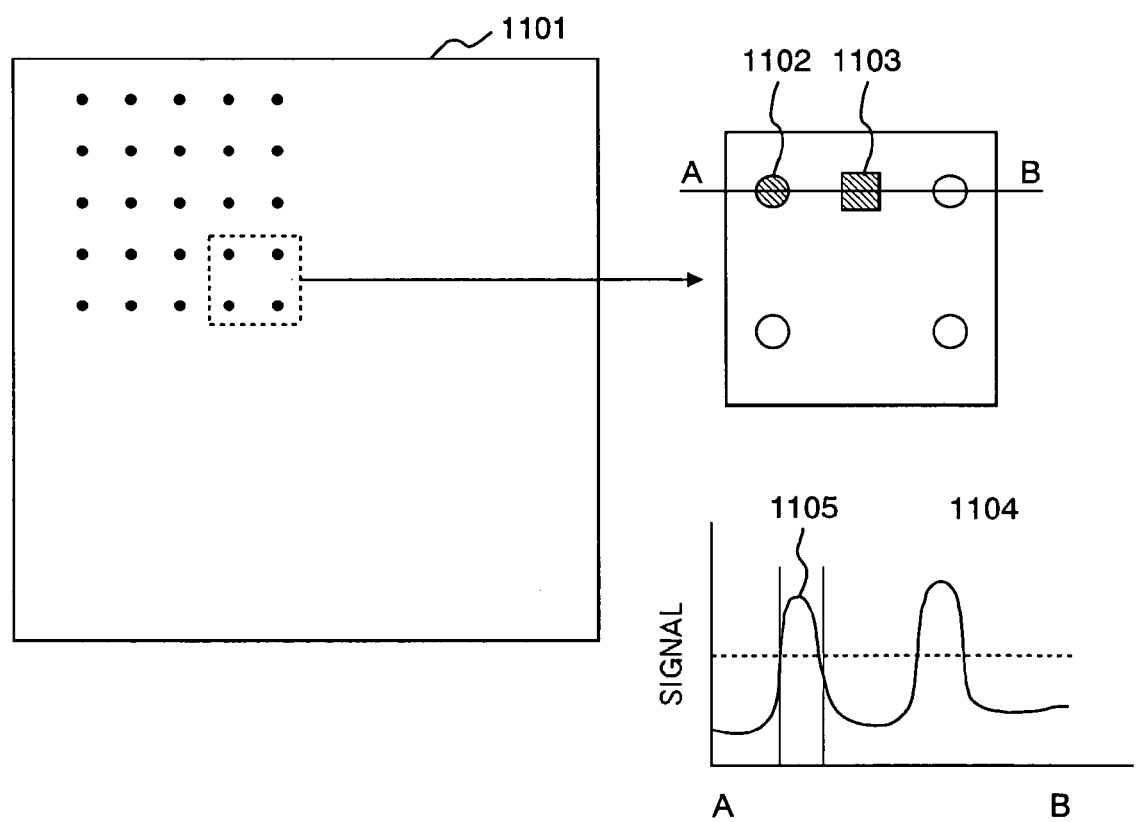
FIG. 13 is a diagram to explain a voltage contrast image of a wafer with a less number of patterns and a principle of image processing for inspection condition optimization in a fourth embodiment of the present invention.
Figure 14:
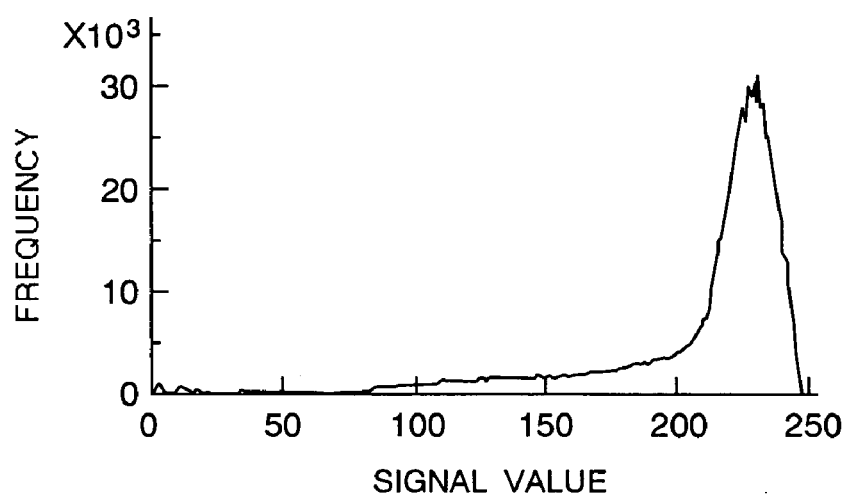
FIG. 14 is a graph to describe a histogram of the voltage contrast image of a wafer with a less number of patterns shown in FIG. 13.
Figure 15:
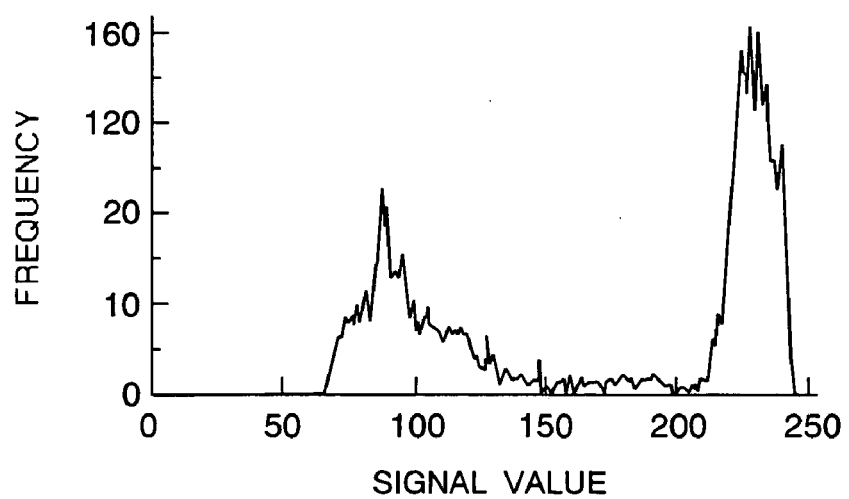
FIG. 15 is a graph to describe a histogram obtained after processing the voltage contrast image of a wafer with a less number of patterns shown in FIG. 13.

For a wafer with a sparse pattern density denoted by reference numeral 1101 in FIG. 13, a good contrast appears to be obtained, but it was realized that, in a histogram drawn, a peak produced by a pattern area is merged into signals produced from silicon oxide areas, as shown in FIG. 14. Therefore, it was impossible to determine an optimal condition by the method described in the First Embodiment section. As is shown in a view at upper right in FIG. 13, extracting a pattern area 1102 and setting a region 1103 with the same area as the area-set pattern in the middle of a line from the pattern area 1102 to the nearest pattern are performed. Extracting the area 1102 corresponds to a range 1105 within the half width of a peak in a signal profile 1104 shown at lower right in FIG. 13. After extracting an image (signal extraction) in this way, a histogram is drawn again; as a result, the histogram which is shown in FIG. 15 was obtained, wherein two separate peaks could be observed. Before signal extraction, shading may be removed from the image.

Figure 3:
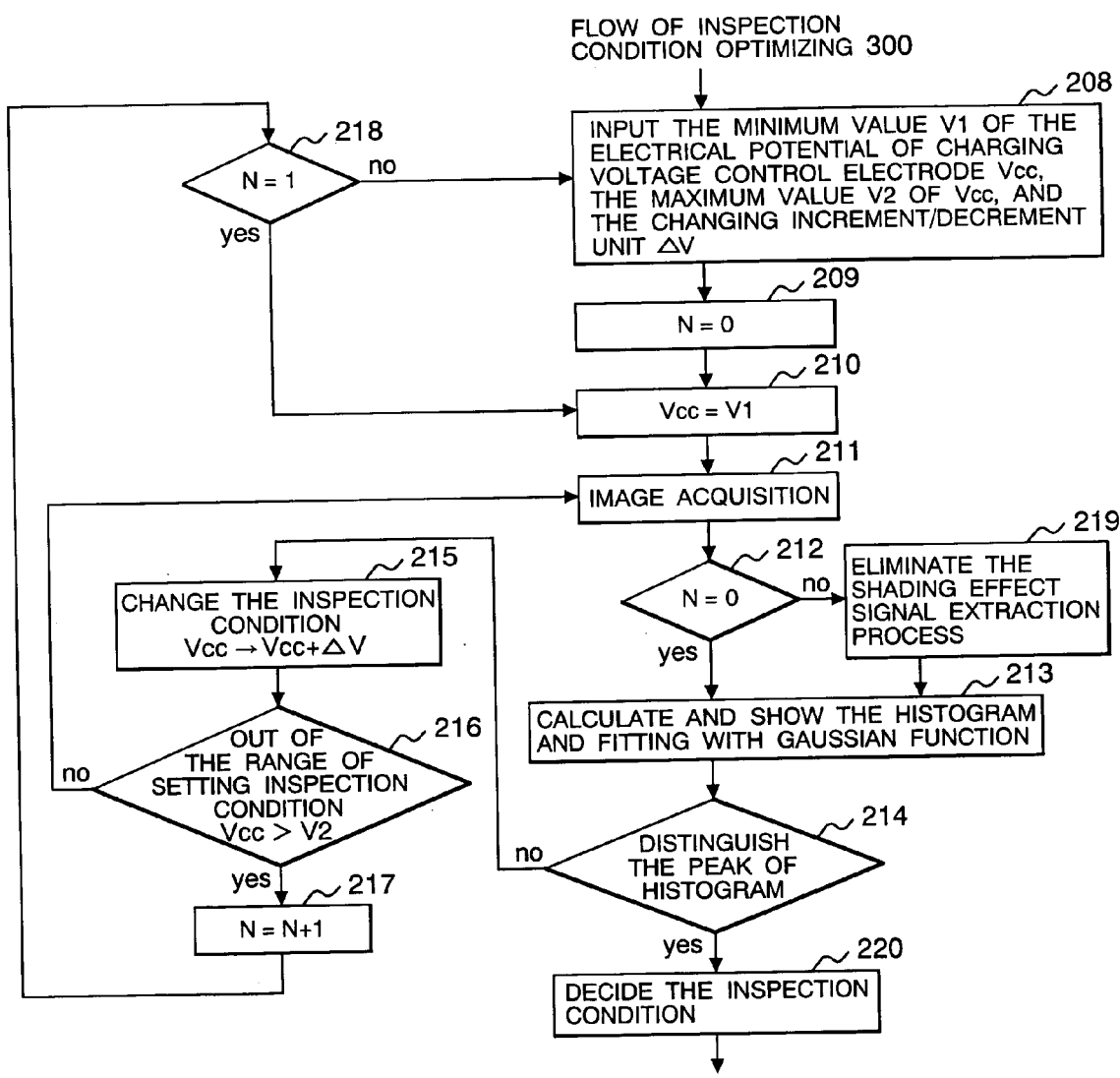
FIG. 3 is a flowchart to explain another example of the flow of inspection condition optimization included in the inspection flow of FIG. 2A.
Figure 4:
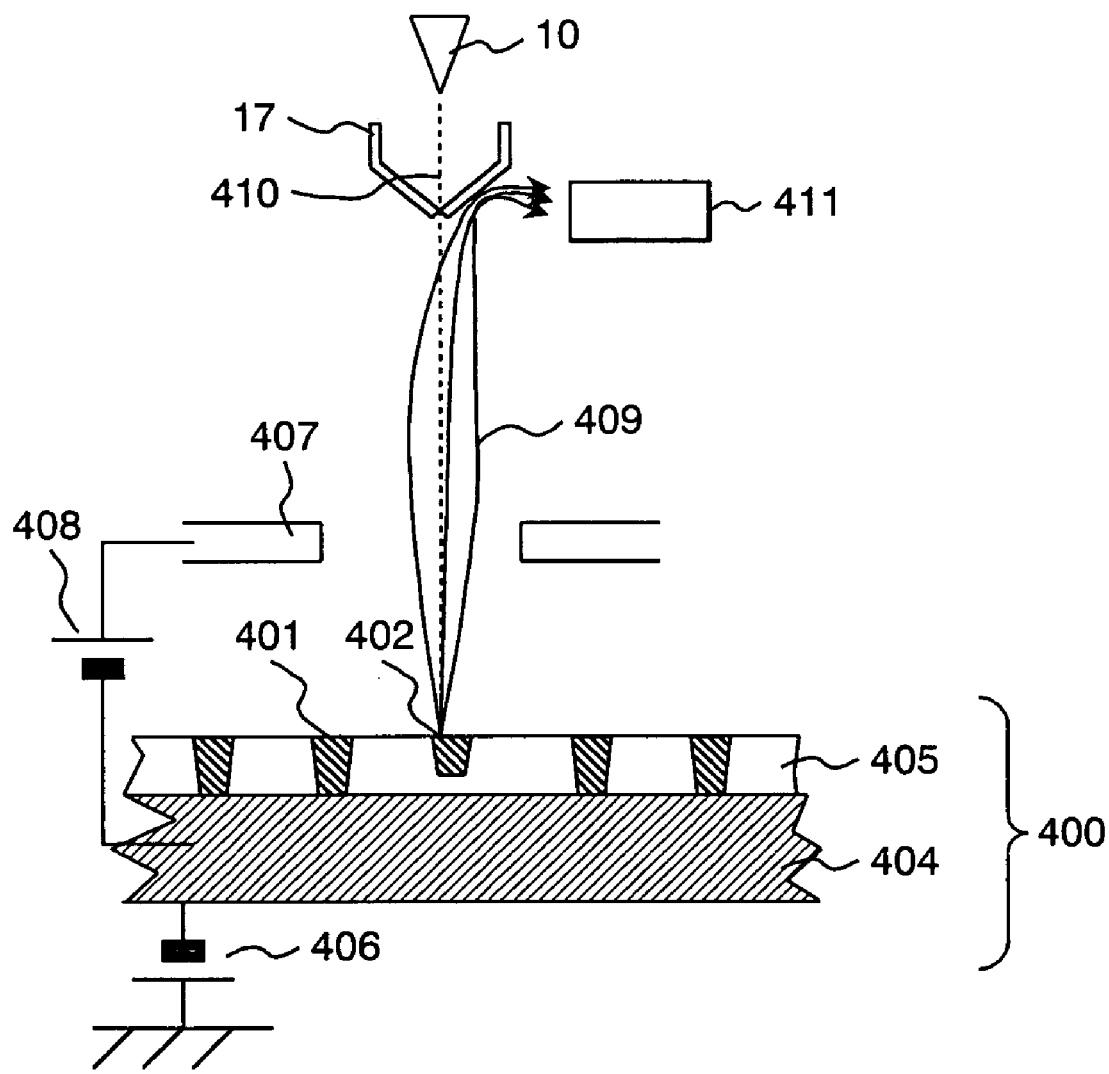
FIG. 4 is a diagram to explain a principle of obtaining a voltage contrast image.
Figure 5:
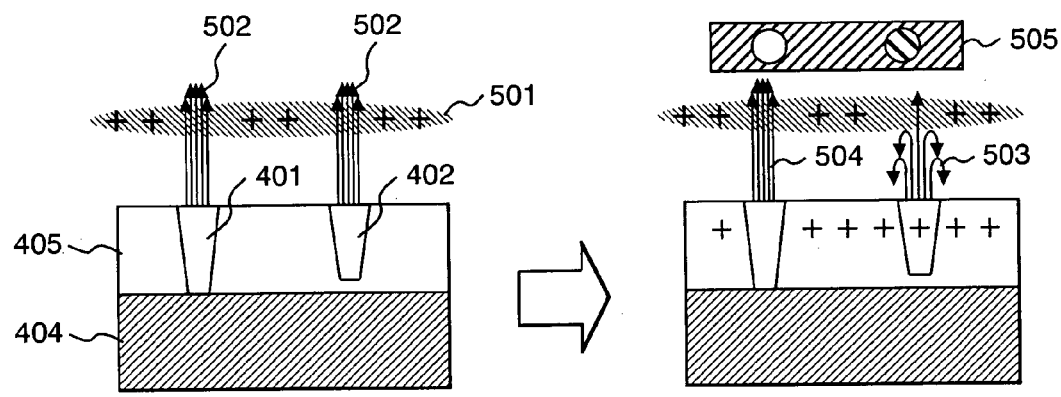
FIG. 5 is a diagram to explain a principle of obtaining a voltage contrast image by positive charging.
Figure 6:
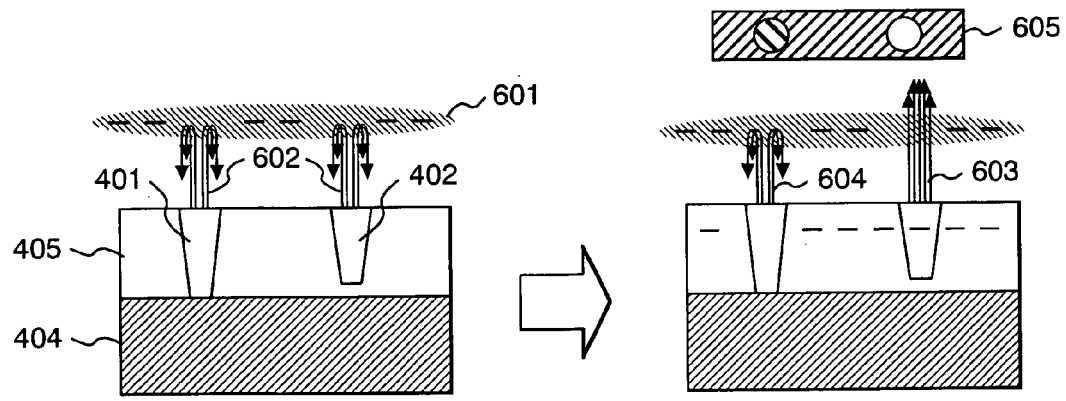
FIG. 6 is a diagram to explain a principle of obtaining a voltage contrast image by negative charging.
Figure 7:
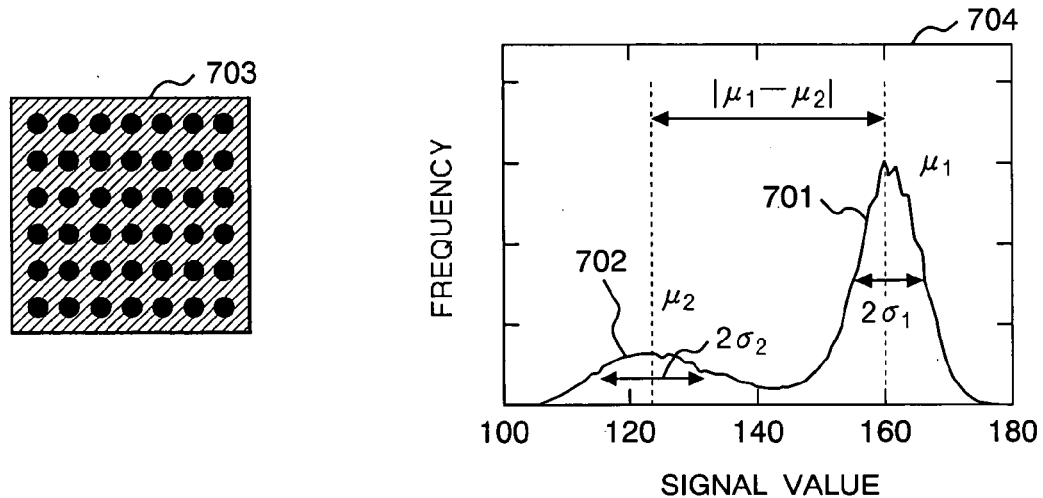
FIG. 7 is a diagram to explain a voltage contrast image and its histogram in the present invention.

A flow of inspection condition optimization 300 in which the foregoing is carried out is shown in FIG. 3. In step 208, a minimum voltage of Vcc, V1, a maximum voltage V2, and an increment/decrement unit ΔV in which the voltage is changed are input. In step 209, a numeric value N is set to 0; this value is used to determine whether to proceed to eliminating the shading effect and signal extraction at a later step. In step 210, V1 is input as an initial condition of Vcc. In step 211, an image is obtained. When the image is obtained, auto brightness and contrast control of signal values is not performed. In step 212, a decision is made subject to the N value. If N=0, an image histogram is calculated and Gaussian fitting according to Equation 1 is performed in step 21. In step 214, it is determined whether separate peaks appear, based on Equation 2. If it is impossible to obtain separate peaks, the Vcc value is changed in step 215. By the decision made in step 216, if the changed value of Vcc falls within the range specified in step 208, an image is obtained again in step 211 and the above steps 211 to 216 are repeated. If the changed value of Vcc falls outside the range specified in step 208 by the decision made in step 216, 1 is added to N in step 217. After it is determined whether N=1 in step 218, the procedure proceeds to steps 210, 211, and 212. Because N=0 is not true in step 212, the procedure proceeds to step 219. In step 219, eliminating the shading effect and signal extraction are performed. Using the result of signal extraction, step 213 is executed and it is determined whether separate peaks appear in step 214. If separate peaks are not present, the procedure proceeds to step 215. If separate peaks are present, a condition for inspection is determined in step 220. In this way, in the inspection procedure of FIGS. 2A and 2B, this flow of inspection condition optimization 300 is applied instead of the flow of the flow of inspection condition optimization 200; thereby, a condition for inspection could be optimized.

(Fifth Embodiment)

In a fifth embodiment, an instance of defect classification using review SEM is discussed.

Figure 16:
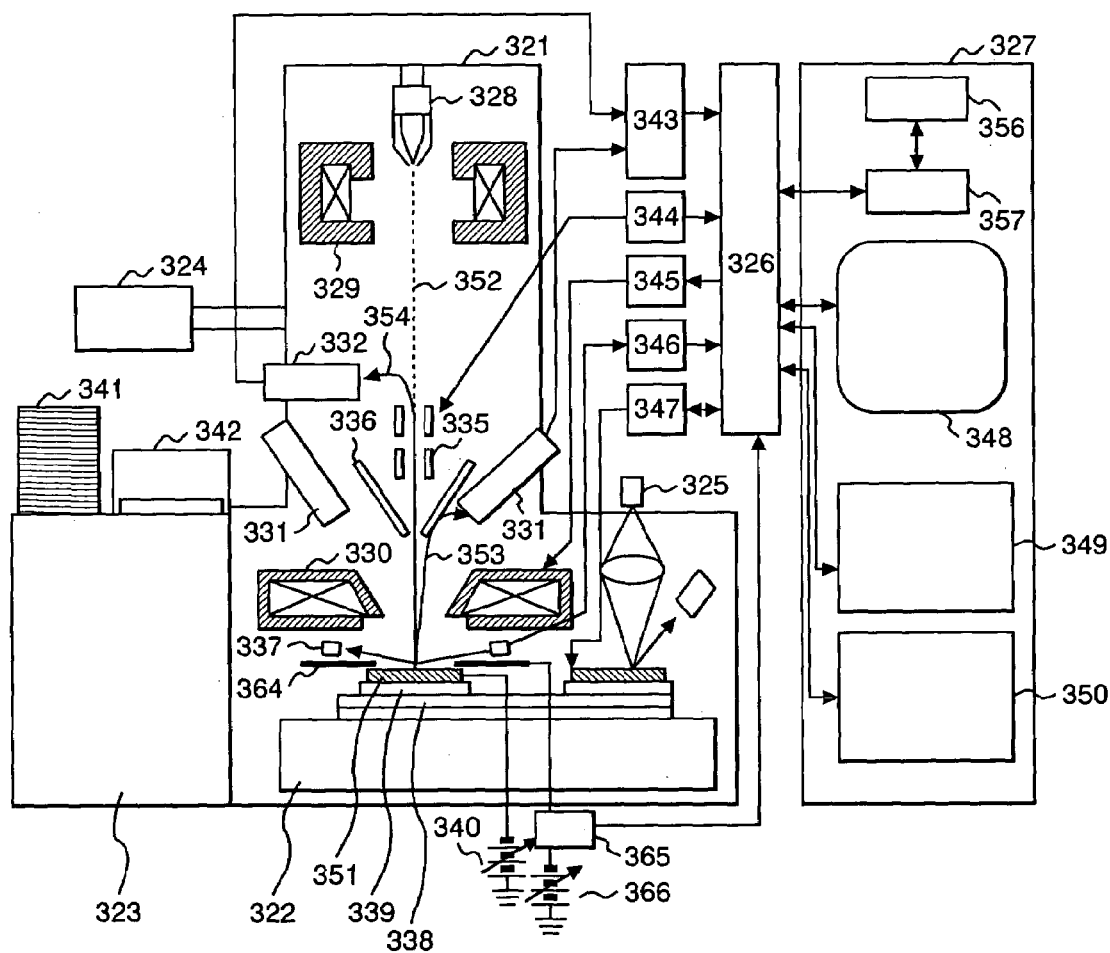
FIG. 16 is a review SEM system configuration for use in a fifth embodiment of the present invention.

FIG. 16 shows an example of a review SEM system configuration. This system comprises electron optics 321, a stage mechanism unit 322, a wafer handling unit 323, a vacuum unit 324, an optical microscopy 325, a control unit 326, and an operation unit 327.

The electron optics 321 comprise a cathode 328, condenser lenses 329, objective lenses 330, first detectors 331, a second detector 332, deflectors 335, converter electrodes 336, and wafer height detectors 337. Reflected electrons 353 and secondary electrons 354 emitted when an electron beam 352 is applied to a wafer 351 are detected by the first detectors 331 and the second detector 332, respectively.

The stage mechanism unit 322 comprises an XY stage 338, a holder 339 on which a wafer is mounted as a sample, and a retarding power supply 340 for applying a negative voltage to the holder 339 and the wafer 351. A position detector by laser length measurement is attached to the XY stage 338.

The wafer handling unit 323 comprises a wafer cassette setting position 341 and a wafer loading/unloading unit 342. The holder 339 on which the wafer 351 is mounted is moved from the wafer loading/unloading unit 342 to the XY stage 338 and vice versa.

The control unit 326 comprises a signal detection control unit 343, a beam deflection correction control unit 344, an electron optics control unit 345, a detector unit of wafer height sensor 346, and a stage and other mechanics control unit 347. The operation unit 327 comprises a operation monitor and operation unit 348, an image processing unit 349, and an image and inspection data storing unit 350.

A charging voltage control unit comprises charging voltage control electrodes 364 installed facing toward the stage, a charging voltage control electrode control unit 365, and a charging voltage control electrode power supply 366.

Figure 17:
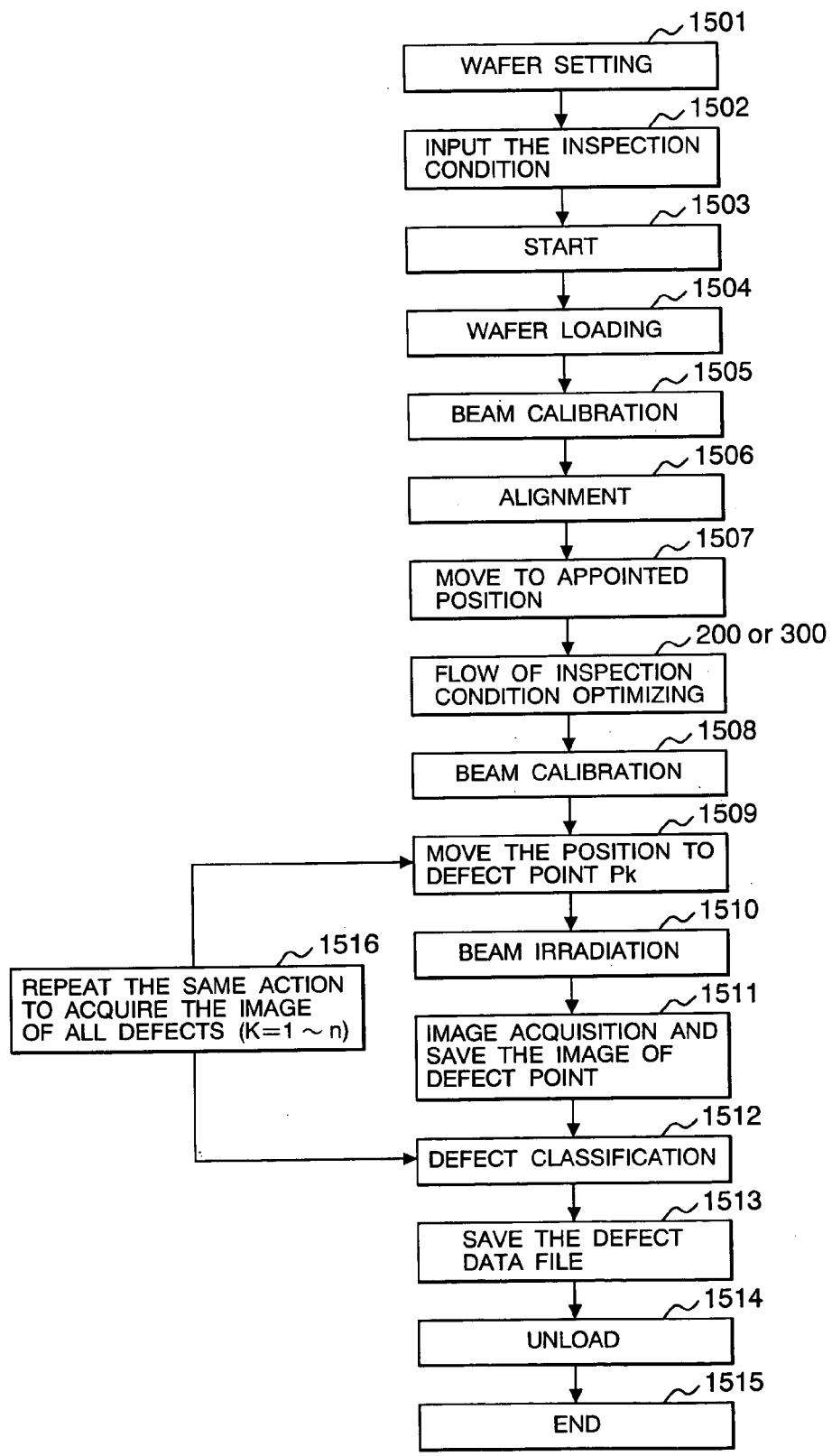
FIG. 17 is a flowchart to explain an example of an inspection procedure in the fifth embodiment of the present invention.

Next, the operation of the components shown in FIG. 16 will be described with a flowchart shown in FIG. 17.

First, in step 1501, set a wafer 351 in an arbitrary shelf in a wafer cassette and set the wafer cassette in the wafer cassette setting position 341 in the wafer handing unit 323. Next, in step 1502, to specify the wafer 351 to be reviewed, specify the in-cassette number of the shelf in which the wafer has been set via the operation monitor 348. In review, inspection of another inspection system was performed for the wafer and, based on inspection result information including information about the location a defect or the like, an electron beam image is generated for close observation. Thus, select an inspection result file via the operation monitor and operation unit 348. For this selection, an inspection result file obtained through communication over a network or the like may be read into the system or an inspection result file can be read from a recording medium into the system. In either case, by specifying the identifier of an inspection result file, the inspection result data is read into a data input unit 356 and may be converted into a data format and a coordinate system for use in the review SEM system by a data converter 357. Furthermore, enter a review condition file identifier via the operation monitor and operation unit 348. This review condition file consists of combinations of parameters for determining details of review. After entering conditions required for review execution is completed, an automatic review sequence gets started in step 1503.

When the review gets started in step 1503, first, the wafer 351 that has been set is carried into the review system. The wafer handling unit 323 can accommodate wafers with different diameters under inspection and different wafer shapes such as an orientation flat wafer or a notched wafer by using a holder 339 for supporting the wafer 351 appropriate for wafer size and shape. The wafer under inspection is removed from the wafer cassette and mounted on the holder 339 by the wafer loading/unloading unit 342 including an arm, an auxiliary vacuum chamber, etc. The wafer supported by the holder is carried into the chamber for inspection.

After the wafer 35 is loaded in step 1504, electron beam irradiation conditions are set on the components by the electron optics control unit 345, based on the entered conditions for review, in step 1505. An electron beam image of a specific area on the wafer 351 is obtained and focusing and astigmatism adjustments are performed, according to the image. At the same time, the wafer 351 height is obtained by the wafer height detector 337 and a correlation between the height information and the electron beam focusing condition is obtained. Subsequently, automatic adjustment to an optimal focusing condition in accordance with the wafer height detected will be performed without executing focusing each time an electron beam image is obtained. Thereby, electron beam images can be obtained continuously at a high speed.

After electron beam irradiation condition setting and focusing and astigmatism adjustments are completed, alignment for two points on the wafer is performed in step 1506.

Then, after a move to a pattern on the wafer in step 1507, the procedure following the flow of inspection condition optimization 200 (FIG. 2B) or 300 (FIG. 3) is performed as is the case for the first and fourth embodiments. Then, beam calibration 1508 is performed again.

In step 1509, rotational and coordinate corrections are performed, based on the result of alignment, and a move to the location of a defect to be reviewed occurs, based on information from the inspection result file that has been read beforehand.

After the move to the defect location, beam irradiation is performed in step 1510 and an image is obtained instep 1511.

In step 1512, the large magnification image obtained is stored if necessary into the image and data storing unit 350. It is possible to set a review condition file to be stored or not to be stored in advance and to store a plurality of types of images obtained by a plurality of detectors simultaneously, if necessary, according to the setting. For example, an image generated by secondary electrons detected by the second detector 332 and an image generated by reflected electrons detected by the first detectors 331 can be stored together.

Simultaneously with storing an image or images in step 1512, the image processing unit 349 extracts defect features from the image information and automatically classifies the defect. The classification result is coded in numbers, for example, 0 to 255 and the code number is written into a field for defect classification code in the inspection result file. The above defect reviewing operation is repeated at step 1516. Upon completion of the above series of actions for all defects specified to be reviewed on one wafer, the inspection result file (into which classification results have been written) for the wafer is automatically saved and the file is output to a destination specified. Then, the wafer is unloaded in step 1514 and review terminates in step 1515.

By using this method, defects detected by inspection SEM can be reviewed completely and classified.

While Gaussian functions are used as the functions to which histograms should be fit in the flow of inspection condition optimization 200 or 300 in this embodiment, a function with an isolated peak such as a Lorentz function may be used besides these functions.

If an image has shading, it is preferable to carry out the flow of inspection condition optimization 200 or 300 after shading correction is performed. Alternatively, it may also preferable to specify an area where no shading occurs and carry out the flow of inspection condition optimization 200 or 300.

When a condition for inspection is optimized, each time the condition is changed, image acquisition is performed, but the effect of charging and contamination under the previous condition may be unignorable. In this case, to eliminate such effect, ultraviolet light irradiation may be performed. Alternatively, a wafer area from where an image is obtained may be shifted from one area to another whenever the condition for inspection is changed.

(Sixth Embodiment)

Figure 18:
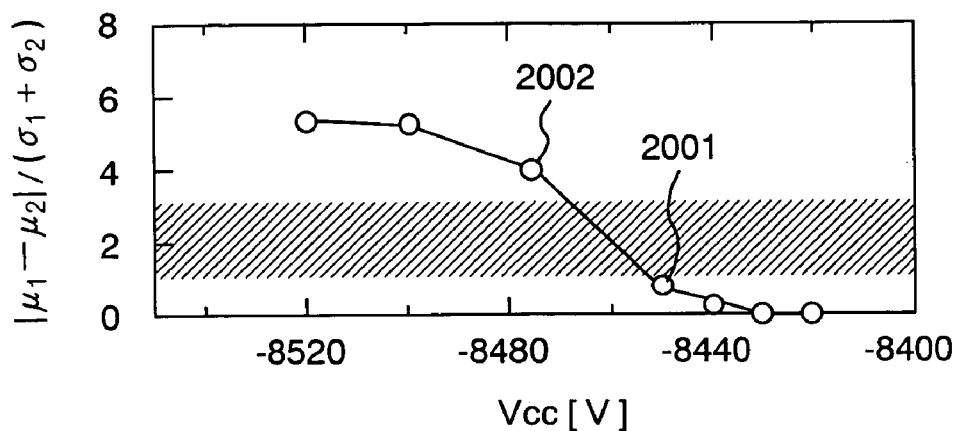
FIG. 18 is a graph used to determine an optimal value of Vcc in a sixth embodiment of the present invention.
Figure 19:
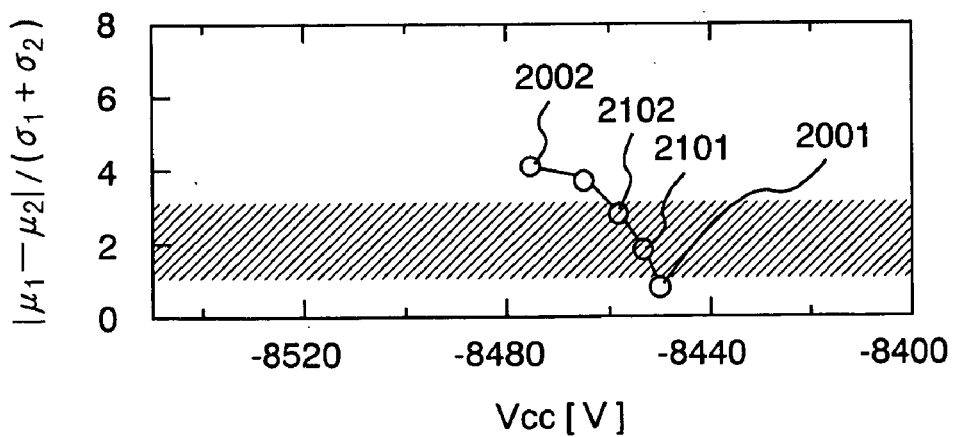
FIG. 19 is a graph used to determine a Vcc value according to the flow of inspection condition optimization in the sixth embodiment of the present invention.

In the flow of inspection condition optimization 200 (FIG. 2B) or 300 (FIG. 3) of the first to fifth embodiments, an instance where, when the condition for inspection is changed, faster condition setting can be performed by changing the increment/decrement unit in which the condition is changed multiple times is discussed. In the sixth embodiment, among the conditions for inspection, the Vcc value of the charging voltage control electrode power supply 67 (inspection SEM) or 366 (review SEM) is optimized. Initially, with the increment/decrement unit ΔV of 40 V for the Vcc, the flow of inspection condition optimization 200 or 300 was performed. Image histograms are fit to Equation 1 and variance of $|\mu_1-\mu_2|/(\sigma_1+\sigma_2)$ depending on Vcc which is altered, which is shown in FIG. 18, was obtained. Because the increment/decrement unit ΔV is large, it was unable to determine Vcc satisfying the condition for ideal separate peaks, $\epsilon_1=1$ and $\epsilon_2=3$ in Equation 2. However, it was able to find Vcc values 2002 and 2001 near to the range of the above condition. Then, between these Vcc voltages, the unit ΔV was set to a smaller value of 10 V and the flow of inspection condition optimization was performed again. As a result, it was able to find Vcc values 2101 and 2102 satisfying Equation 2. If two ore more Vcc values satisfying the condition are found, a average of th Vcc values is regarded as an optimal condition. This method allows for faster inspection condition optimization than when a smaller value is initially used as the unit ΔV.

(Seventh Embodiment)

If a plurality of types of patterns are present on a wafer, it may occur that an optimal condition for inspection is not fixed to one. In the seventh embodiment, a method of determining a condition for setting in that case is discussed.

Figure 20:
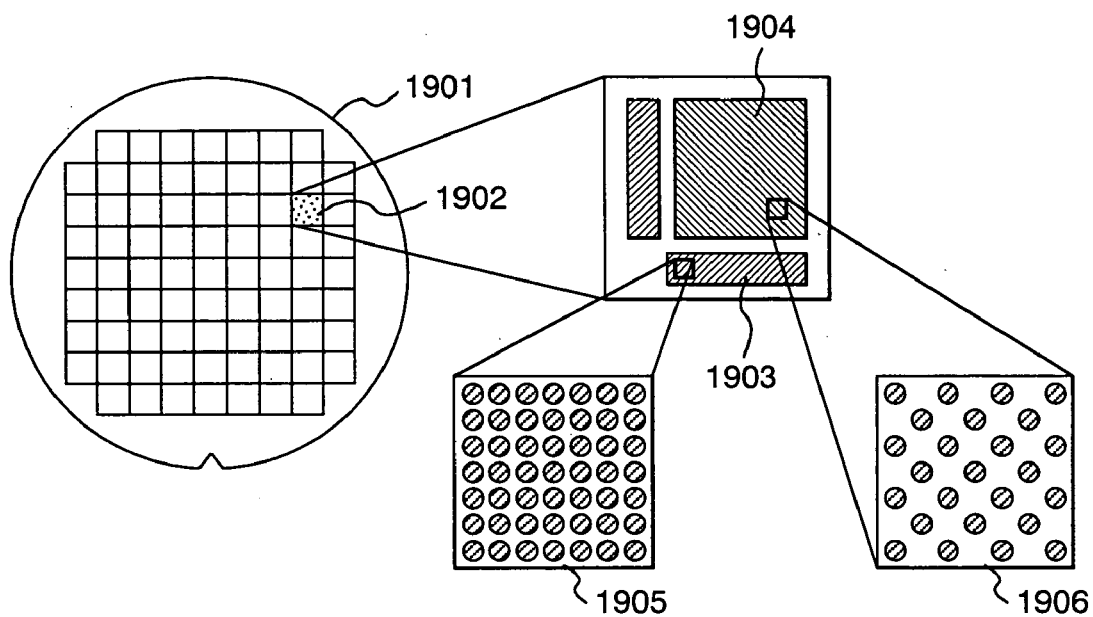
FIG. 20 is a diagram showing a wafer having a plurality of patterns formed in a seventh embodiment of the present invention.

A wafer 1901 shown in FIG. 20 has regions 1903 and 1904 and patterns 1905 and 1906 are formed respectively in these regions. In the procedure following the flow of inspection condition optimization 200 or 300, the Vcc voltage of the charging voltage control electrode power supply 67 was optimized as a condition for inspection. As a result, it was found that the condition differs, depending on the patterns. For the pattern 1905, Vcc=−8460 V is an optimal condition, whereas, for the pattern 1906, Vcc=−8440 V is an optimal condition. In this case, (1) a method of using an average of these Vcc values or (2) a method of executing inspection for each pattern with a different Vcc optimal for the pattern can be selected as required. A merit of the method (1) is shorter inspection time, because scanning the entire wafer surface under the same Vcc condition, though the condition somewhat differs from the optimal value. A merit of the method (2) is that inspection can be performed at higher sensitivity, because an optimal condition for inspection is applied for each pattern, though the inspection procedure must be repeated twice and takes longer.

(Eighth Embodiment)

From data acquired by inspection condition optimization carried out as in the first to seventh embodiments, conditions for inspection can be stored on a database, which allows for faster inspection condition setting.

Figure 21:
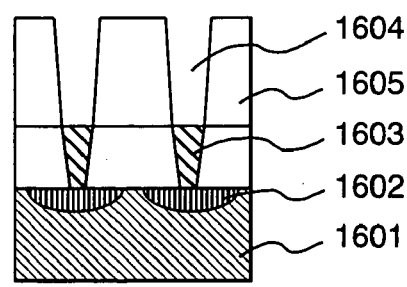
FIG. 21 is a diagram showing a cross section structure of a pattern in an eighth embodiment of the present invention.
Figures 22, 23:
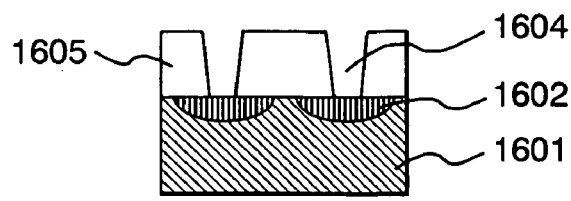
FIG. 22 is a diagram to explain a database of conditions for inspection for the pattern shown in FIG. 21.
FIG. 23 is a diagram showing a cross section structure of a wafer inspected in the eighth embodiment of the present invention.

An example of such database is shown in FIGS. 21 and 22. FIG. 21 shows a cross sectional view of pattern, where reference numeral 1601 denotes a silicon substrate, 1602 pn junction, 1603 a plug embedded in a contact hole, 1604 contact hole, and 1605 silicon oxide. As the result of classification by typical items that characterize a pattern: with or without the plug 1603 pattern, aspect ratio (of the contact hole 1604), and with or without pn junction 1602, the conditions for inspection can be arranged as in FIG. 22. The conditions for inspection are possible in three ways (1) to (3) below:

(1) Vac=−10 kV, Vr=−9.5 kV, Vcc=−5 kV
(2) Vac=−10 kV, Vr=−8.5 kV, Vcc=−8.7 kV
(3) Vac=−10 kV, Vr=−8.5 kV, Vcc=−8.8 kV where Vac is voltage of the cathode 10, Vr is voltage of the retarding power supply 36, and Vcc is voltage of the charging voltage control electrodes 65.

Next, using this database, wafer inspection was performed. FIG. 23 shows a cross section structure of the wafer inspected. By fitting to the database in FIG. 22, because the pattern is not plugged and has a low aspect ratio and pn junction, the condition for inspection (1) was selected. Under this condition, inspection was performed and it was able to detect disconnected failure at high sensitivity. Because a condition for inspection is selected using the database, faster inspection condition optimization can be performed than when the flow of inspection condition optimization 200 (FIG. 2B) or 300 (FIG. 3) is applied.

While the foregoing embodiments relate to inspection SEM, condition setting can be performed in the same method for other SEMs (e.g., review SEM, CD-SEM). While the inspection system examples using an electron beam have been described in detail, the basic concept of the present invention can be applied to an inspection system using an ion beam or the like, not limited to the electron beam.

As fully described above, according to the present invention, in inspecting partially finished circuit boards such as semiconductor devices with circuit patterns, problems with conventional SEM inspection including lack of repeatability of defect detection results and impossibility of setting conditions for high sensitivity inspection due to relying on the operator's experience can be solved. By automatically setting conditions for inspection, time to set the conditions can be shortened. Moreover, the inspection system is capable of setting well-repeatable optimal conditions with high accuracy and has improved sensitivity of detecting defects; consequently, semiconductor products can be monitored with high sensitivity.

What is claimed is:

1. An inspection method using a charged particle beam comprising the steps of: scanning an area on a surface of a substrate having a specific pattern formed thereon with a primary charged particle beam; detecting signals of secondary electrons emitted from the area by irradiation with the primary charged particle beam; forming an image of the area from the detected signals; and generating a histogram from the image, wherein all these steps are performed each time a condition of irradiation with the charged particle beam is changed, when two or more separate peaks appear in said histogram, the histogram is determined as a condition for inspection, and inspection is performed based on the image obtained under that condition.

2. The inspection method using a charged particle beam according to claim 1, wherein said method includes changing at least one of beam current, beam energy, irradiation area, potential distribution between a wafer and an electrode in the periphery of the wafer to change the condition of irradiation with said charged particle beam.

3. The inspection method using a charged particle beam according to claim 1 or 2, further comprising the steps of: fitting a histogram to the sum of a plurality of Gaussian functions to determine whether said peaks appear in the histogram; calculating an average and a standard deviation of each Gaussian function; and calculating a quotient of dividing an absolute value of difference between the averages of adjacent Gaussian functions by the sum of the standard deviations of the Gaussian functions, wherein a condition for inspection is set so that the quotient falls between 1 and 3 and inspection is performed under that condition.

4. The inspection method using a charged particle beam according to claim 1 or 2, further comprising the steps of: fitting a histogram to the sum of a plurality of Lorentz functions to determine whether said peaks appear in the histogram; calculating an average and a half width of each Lorentz function; and calculating a quotient of dividing an absolute value of difference between the averages of adjacent Lorentz functions by the sum of the half widths of the Lorentz functions, wherein a condition for inspection is set so that the quotient falls between 1 and 3 and inspection is performed under that condition.

5. The inspection method using a charged particle beam according to claim 3, wherein, as preprocessing for calculating said histogram, the steps of extracting signals from a pattern area and a no pattern area of the image and calculating a histogram of the signals are performed.

6. The inspection method using a charged particle beam according to claim 3, wherein, if an image has shading, as preprocessing for calculating said histogram, an image processing step of eliminating the shading is performed.

7. The inspection method using a charged particle beam according claim 1, wherein fixed conditions for inspection are stored on a database and, when inspection is performed, a condition which is close to a wafer to be inspected is selected from the existing inspection condition database and use as the condition for inspection.

8. The inspection method using a charged particle beam according to claim 1, further comprising the step of inspecting a pattern defect by comparing said image with a reference image.

9. The inspection method using a charged particle beam according to claim 1, further comprising the steps of comparing a first area image and a second area image, detecting a difference, and, based on a result of the detection, checking for a defect in said circuit pattern.

10. The inspection method using a charged particle beam according to claim 1, further comprising the steps of, based on defective coordinates obtained from a visual inspection device, obtaining an image on the coordinates, obtaining information on shape, contrast, and unevenness of the image, and classifying the image.

11. The inspection method using a charged particle beam according to claim 1, wherein said charged particle beam is an electron beam.

12. An inspection a stem using a charged particle beam comprising a sample holder an which a sample is mounted, objective lenses for applying a primary charged particle beam to the sample on said sample holder, a control unit which manages changing a condition of irradiation with the charged particle beam, a detector which detects secondary electrons emitted from said sample, an image storing unit for storing signals corresponding to an image of an area to be inspected, using signals from said detector, and an arithmetic unit which calculates a histogram of said image to determine a condition for inspection.

13. The inspection system using a charged particle beam according to claim 12, further comprising charging voltage control electrodes capable of applying a voltage to a front surface of said sample to change a charging voltage.

14. The inspection system using a charged particle beam according to claim 12 or 13, further comprising a comparison operation circuit which generates an image based on the signals from said detector, and compares the image to be inspected with another image of a corresponding circuit pattern and an arithmetic circuit to detect a defect in the circuit pattern of said sample from a result of the comparison by the comparison operation circuit.

15. The inspection system using a charged particle beam according to claim 12 or 13, further comprising a calculation unit which generates an image, based on the signals from said detector, and classifies the image according to defect type.

* * * * *